METHOD OF MANUFACTURING SEMICONDUCTOR DEVICES
Original Filed May 2, 1957
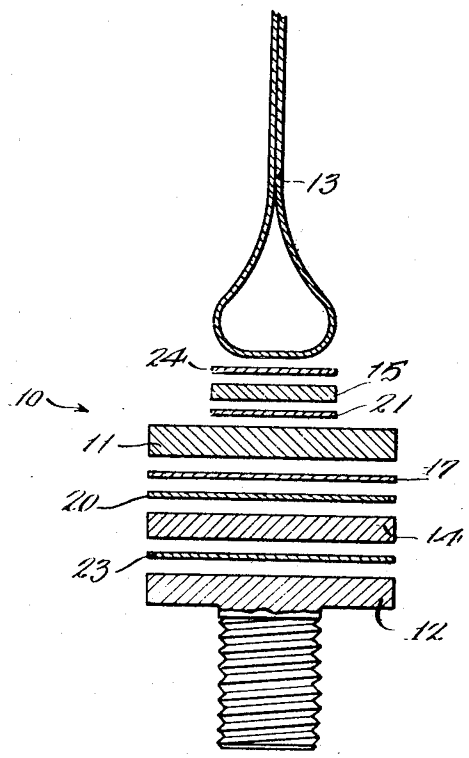
INVENTORS.
George B. Finn, Jr.
and Robert Parsons
BY
Mason, Kolehmainen, Rathburn & Wyss
Attys

United States Patent Office 3,166,449
Patented Jan. 19, 1965

3,166,449

METHOD OF MANUFACTURING SEMICONDUCTOR DEVICES

George B. Finn, Jr., Los Angeles, Calif., and Robert C. Parsons, Cincinnati, Ohio, assignors to Sarkes Tarzian, Inc., Bloomington, Ind., a corporation of Indiana Original application May 2, 1957, Ser. No. 656,621, now Patent No. 3,051,878, dated Aug. 28, 1962. Divided and this application Jan. 2, 1962, Ser. No. 163,610
5 Claims. (Cl. 148—177)

The present invention relates to semiconductor devices and principally to high current capacity P–N junction silicon rectifiers which are suitable for use as power rectifiers. Specifically, this application is a division of a prior application, Serial No. 656,621, filed May 2, 1957, which issued as U.S. Patent No. 3,051,878, and is assigned to the same assignee as the present invention.

P–N junction silicon rectifiers have heretofore been used in low power applications, and because of their high forward-to-reverse current resistivity ratio it would be desirable also to use them for relatively high power applications where, for example, selenium rectifiers are now employed. Since silicon rectifiers heretofore known operate satisfactorily only when the silicon is maintained at relatively low temperatures as, for example, below 200° C., means must be provided for dissipating the heat generated at the junction during use and heat sinks having large masses have been employed for cooling the silicon. In order to operate efficiently, the heat sinks should be attached to the silicon through a good thermoconductive connection. A suitable solder may be used for this purpose.

Although silicon rectifiers are very small in size as compared to selenium or other rectifiers of comparable current and power capacity, their cost of manufacture has been so much higher than that of selenium rectifiers or the like that the silicon rectifiers have been used, principally, only for special applications where space or high quality operation is an important factor. Therefore, in order to make the cost of silicon rectifiers competitive with other power rectifiers of similar current ratings, their manufacutring cost must be greatly decreased. This is accomplished in accordance with the present invention by simultaneously forming the P–N junction in a silicon wafer and soldering suitable terminal members and heat sinks to opposite sides of the junction in a single heating operation. Moreover, this junction forming and fusion operation is carried out at temperatures which are critical and with materials not having critical compositions of numerous elements.

It is a principal object of this invention to provide a new and improved rectifier and a method of manufacturing it.

Another object of this invention is to provide a silicon rectifier in which all solder bonds and a P–N junction are formed during a single high temperature operation.

A further object of this invention is to provide an improved method of forming a P–N junction in a silicon crystal wafter.

Briefly, the above and further objects are realized in accordance with the present invention by providing a rectifier which includes a set of transition members which are interposed between the silicon crystal and the terminal members, which transition members are formed of tantalum or niobium. These transition members are soldered to opposite sides of the crystal wafer during an alloying operation in which the P–N junction is formed in the silicon crystal. One of the transition members has a cross-sectional area which is substantially less than that of the wafer, and the other transition member has a cross-sectional area which is approximately equal to or larger than that of the wafer. This configuration and relative sizes of elements are conventional and insure a large surface leakage path between the transition members.

In accordance with an important aspect of the present invention, the P–N junction is formed by an alloying process in which the side of the wafer nearest the large area transition member is alloyed to form the junction. This manner of forming the junction provides a P–N junction which extends across the entire cross-sectional area of the crystal. If the junction is formed from the opposite or small area side, as has formerly been done in all silicon diodes, the area of the P–N junction which is formed is appreciably less than the cross-sectional area of the wafer and, therefore, the current capacity and the power rating of a wafer of given dimensions is lower.

Further objects and advantages of the present invention may be had from the following detailed description taken in connection with the single figure of the drawing which is a cross-sectional view of a silicon rectifier assembly prior to a heating operation in which the parts thereof are fused together and a P–N junction is formed in a silicon wafer.

Referring now to the drawing wherein is illustrated an assembly 10 of the principal components of a silicon rectifier embodying the present invention, the stack of elements is shown prior to the formation of a P–N junction in the single crystal silicon wafer 11 and the fusion of the individual components of the rectifier together.

In addition to the silicon wafer 11, which is of the N-type, the assembly 10 comprises an end contact and heat sink 12, a resilient contact 13, and a pair of transition members 14 and 15 which are respectively disposed between the silicon wafer 11 and the contacts 12 and 13. The silicon wafer 11 is preferably very thin and, as a result, is also very fragile. Therefore, in order to prevent damage to the wafer during the formation of a junction therein and also during use of the completed rectifier, transition members having a thermal coefficient of expansion closely approximating that of silicon are interposed between the contacts 12 and 13 and the silicon wafer. In addition, it is important that the transition members be good conductors of both heat and electricity if satisfactory operation of the diode is to be achieved. Moreover, and in accordance with an important aspect of this invention more fully described hereinafter, the transition members should be formed of a metal which does not react with silicon at the relatively high temperatures at which the junction in the silicon wafer is formed and which may be satisfactorily bonded to the silicon at this temperature. We have found that tantalum, niobium and base alloys of each, satisfactorily meet all of these requirements. While there are other metals such, for example, as molybdenum which have thermal coefficients of expansion similar to that of silicon at relatively low temperatures and which actually have higher thermal and electrical coefficients of conductivity, such metals react with silicon at temperatures below 1000° C. Accordingly, if the transition members are formed of these other metals, the junction forming and fusion operations must be carried out at less than the temperatures at which such reactions occur. However, by using tantalum or niobium for the transition members, temperatures of the order of 1100° C. may be used, and as a result, diodes having lower forward resistance may be produced in an economical manner, close control of the solder ingredients and of the junction forming and fusion temperatures being unnecessary.

In accordance with the present invention, a P–N junction is formed by alloying a portion of an N-type silicon wafer with aluminum. The alloying is accomplished at relatively high temperatures and fusion of the various elements of the rectifier together is carried out in this same operation.

In order to form the P–N junction in the wafer 11 by an alloying process, a thin sheet of aluminum 17, which preferably comprises an aluminum-gallium alloy including a small amount of gallium such, for example, as one to five percent by weight, is positioned adjacent to one face of the wafer 11 between the wafer and the transition member 14. Moreover, in order to provide a good ohmic and mechanical connection between the alloyed portion of the wafer 11 and the transition member 14, a thin sheet of substantially pure tin 20 is interposed between the aluminum sheet 17 and the transition member 14. When, therefore, the assembly is heated to a temperature of the order of 1100° C. during the junction forming alloying operation and its thereafter cooled, the alloyed portion of the wafer 11 is fused to the transition member 14.

In order to provide a good mechanical and purely ohmic connection between the smaller transition member 15 and the wafer 11, a thin sheet or dot of tin or lead 21 having a small percentage such, for example, as one-half percent by weight of a donor impurity such, for example, as antimony, is disposed between the wafer 11 and the transition member 15. Moreover, during the alloying process when the sheet 21 melts, the adjoining surface of the wafer 11 is maintained N positive by the donor impurity so that any acceptor impurity such, for example, as aluminum vapor which may be present during the alloying operation, cannot effect a junction at this side of the wafer.

During the high temperature alloying operation the entire stack of elements including the contacts 12 and 13 may be fused together or, in the alternative, only the transition members need be fused to the wafer 11.

If the entire assembly including the terminal members 12 and 13 is to be fused during the alloying process, thin sheets of lead 23 and 24 are positioned between the transition members 14 and 15 and the contacts 12 and 13. The lead thus provides a solder for bonding the members 14 and 15 to the contacts 12 and 13. Tin is unsuitable for soldering the transition members to the terminal members during the alloying operation, because at the high temperatures used for alloying the tin dissolves or diffuses into the copper terminal. As a result, no interface is effected and the members do not bond together when the unit is cooled.

Under certain circumstances it is preferable to form the junction in one high temperature operation and thereafter to solder the transition members to the terminal members in a lower temperature operation. Therefore, in order to facilitate the making of a good bond between the transition and terminal members during the latter operation, the outer faces of the transition members are tinned during the junction forming operation. Tin may be used for this purpose since the copper is not present during the high temperature junction forming operation and tin does not diffuse or dissolve into tantalum or niobium at the temperatures involved. On the other hand, if the rectifier assembly 10 is fused together in the alloying operation without the contacts 12 and 13, these contacts to be later soldered thereto, the sheets 23 and 24 are formed of tin. The reason for using lead instead of tin when the entire unit is fused during the alloying operation is that at the high temperatures involved in the alloying operation the tin would diffuse into the copper members 12 and 13 so that no bond would be effected between the contacts 12 and 13 and the transition members 14 and 15. When, however, the terminals 12 and 13 are not bonded to the rectifier during the alloying operation, tin may be used and is preferred over lead since it has a lower melting point and provides a better solder.

During the alloying and fusion operation, the assembly 10 is placed in an alloying oven or furnace which is maintained at a temperature of between 850° and 1100° C. At this temperature excellent wetting of the tin or lead to the tantalum and copper occurs. At lower temperatures, such as those which must be employed where the transition members are formed of molybdenum or the like, considerably poorer wetting and thus a poorer bond and an ohmic connection of higher resistance results. While the junction is being formed, the components of the assembly are maintained in compressed relationship by any suitable means such as, for example, a carbon cylinder (not shown) positioned over the upper end of the contact 13, the weight of the cylinder functioning to force the various parts of the assembly onto the contact 12. After the alloying operation is completed, which takes about one to thirty minutes depending upon the thermal inertia of the system, the assembly is removed from the oven and as the temperature thereof decreases the molten parts solidify and the entire assembly is fused together.

Following the fusion and alloying operation the rectifier may be subjected to an etching process to increase its back voltage rating. This etching process removes any extraneous and conductive material which may be present on the exposed surface of the junction. In those cases in which the terminal members are not fused to the transition members during the alloying operation, the rectifier units are not etched until after the terminal members have been soldered thereto.

The process carried out during the etching operation is as follows:

(1) The rectifier is immersed in a boiling etching solution of approximately 10% NaOH for about ten minutes. Alternatively, similar solutions of KOH or LiOH may be used as the etchant.

(2) The assembly is then rinsed as in water, which is preferably boiling, and which has been deionized so as to have a conductivity of not less than 0.010 mmho per centimeter.

(3) After the rinsing operation, the assembly is placed in a water solution of 1–10% nitric acid for about one minute to neutralize the hydroxide and to remove any metals which may have deposited across the surface of the junction.

Upon completion of the etching process, the unit is then finished in accordance with the following process:

(1) The neutralized assembly may then be treated with a solution of soda-ash as described in copending application, Serial No. 654,905, filed in the name of George Eannarino, and assigned to the same assignee as the present invention.

(2) The unit is then washed in distilled water having a conductivity of not less than .050 mmho per centimeter.

(3) The distilled water is then blown off the rectifier by, for example, a jet of steam or hot nitrogen. It is important that the water be blown off the rectifier rather than evaporated from it since evaporation may, in some cases, deposit small amounts of impurities on the junction which would decrease the surface leakage resistance.

(4) The surface of the junction is then coated with silicone varnish having a coating thickness of less than .002 inch. Dow Corning #997 is satisfactory for this purpose. This coating protects the junction from dust and moisture and prevents galvanic action between the various metals of the junction.

(5) The varnished unit is then baked at 180° C. for eight or more hours to cure the varnish and dry out the unit.

(6) While the unit is still warm, a resilient silicone rubber such as, for example, Dow Corning #6126, is troweled onto the unit over the loop in the spring terminal member 13.

(7) The unit is then maintained at a temperature of 180° C. for four hours in order to cure the silicone rubber. The function of the silicone rubber is described in a copending application, Serial No. 656,622, filed in the name of George Eannarino and George B. Finn, Jr., and assigned to the same assignee as the present invention.

While particular embodiments of the invention have been shown, it will be understood, of course, that it is not desired that the invention be limited thereto since modifications may be made, and it is, therefore, contemplated by the appended claims to cover any such modifications as fall within the true spirit and scope of the invention.

Having thus described the invention, what is claimed and desired to be secured by Letters Patent is:

1. A method of making a semiconductor diode which comprises superimposing upon one another in the following order, a transition member formed of one of the group consisting of tantalum and niobium, a thin sheet consisting essentially of tin, a thin sheet of an alloy consisting essentially of aluminum and 1 to 5% by weight of gallium, a thin wafer of an N-type silicon, a thin sheet of a solder consisting essentially of tin and a donor impurity, and another transition member formed of one of the group consisting of tantalum and niobium maintaining each of the components of said stack in contact with the adjacent components; heating said stack to a temperature of between 850° and 1100° C.; maintaining said stack at said temperature for a predetermined time interval, and thereafter reducing the temperature of said stack.

2. A method of making a semiconductor diode which comprises superimposing upon one another in the order specified, a copper terminal member, a thin sheet of lead, a transition member formed of one of the group consisting of tantalum and niobium, a thin sheet consisting essentially of tin, a thin sheet of an alloy consisting essentially of aluminum and 1 to 5% by weight of gallium, a thin wafer of an N-type silicon, a thin sheet of a solder consisting essentially of tin and a donor impurity, another transition member formed of one of the group consisting of tantalum and niobium, a thin sheet of lead, and another copper terminal member, maintaining the components of said stack in contact with the adjacent components and heating said stack to a temperature of between 850° and 1100° C. maintaining said stack at said temperature for a predetermined time interval and thereafter reducing the temperature of said stack to room temperature.

3. A method of making a semiconductor diode which comprises superimposing upon one another in the order specified, a transition member formed of one of the group consisting of tantalum and niobium, a thin sheet consisting essentially of tin, a thin sheet of an alloy consisting essentially of aluminum and 1 to 5% by weight of gallium, and a thin wafer of an N-type silicon, maintaining the components of said stack in contact with the adjacent components and heating said stack to a temperature in the vicinity of 1000° C., maintaining said stack at said temperature for a predetermined time interval and thereafter reducing the temperature of said stack.

4. A method as set forth in claim 2 wherein said terminal members are formed of copper and sheets of lead are interposed between the terminal members and the transition members to effect fusion thereof.

5. A method according to claim 3 wherein said sheet of aluminum and gallium has a cross sectional area substantially equal to the adjacent surface of said silicon wafer, whereby a PN junction is produced across the entire cross section of said wafer.

References Cited in the file of this patent

UNITED STATES PATENTS

| | | |
|---|---|---|
| 2,763,822 | Frola et al. | Sept. 18, 1956 |
| 2,801,375 | Losco | July 30, 1957 |
| 2,917,686 | Boyer et al. | Dec. 15, 1959 |
| 2,922,092 | Gazzara et al. | Jan. 19, 1960 |
| 2,945,285 | Jacobs | July 19, 1960 |